United States Patent [19]
Yoo et al.

[11] Patent Number: 5,505,870
[45] Date of Patent: Apr. 9, 1996

[54] PIEZOELECTRIC CERAMIC-POLYMER COMPOSITE MATERIAL AND METHOD FOR PREPARING THE SAME

[75] Inventors: Kwang Soo Yoo; Hyung Jin Jung; Han Sang Song; Hyun Nam Cho, all of Seoul, Rep. of Korea

[73] Assignee: Korea Institute of Science and Technology, Seoul, Rep. of Korea

[21] Appl. No.: 350,330

[22] Filed: Dec. 6, 1994

[30] Foreign Application Priority Data

Apr. 20, 1994 [KR] Rep. of Korea ............. 8358/1994

[51] Int. Cl.$^6$ ............. C04B 35/46; H01B 3/00
[52] U.S. Cl. ............. 252/62.9 PZ; 264/176.1; 264/177.1
[58] Field of Search ............. 252/62.9 R, 62.9 PET; 264/176.1, 177.1; 310/800, 311, 320, 358, 368

[56] References Cited

U.S. PATENT DOCUMENTS

| | | | |
|---|---|---|---|
| 4,613,784 | 9/1986 | Haun et al. | 310/358 |
| 4,624,796 | 11/1986 | Giniewicz et al. | 252/62.9 |
| 4,944,891 | 7/1990 | Sagong et al. | 252/62.9 |
| 4,977,547 | 12/1990 | Giniewicz et al. | 252/62.9 |
| 5,246,610 | 9/1993 | Banno et al. | 252/62.9 |

*Primary Examiner*—C. Melissa Bonner
*Attorney, Agent, or Firm*—Scully, Scott, Murphy & Presser

[57] ABSTRACT

There are a piezoelectric ceramics-polymer composite material and a method for the preparation of the same which comprises 10 to 60% by volume of silane-coated PZT piezoelectric ceramics powder based on the total volume of the composition;

at most 3% by volume of carbon powder based on the total volume of the composition; and balance volume of PVdF piezoelectric polymer.

9 Claims, 3 Drawing Sheets

PIEZOELECTRIC CERAMIC-POLYMER COMPOSITE MATERIAL AND METHOD FOR PREPARING THE SAME

BACKGROUND OF THE INVENTION

1. Field of the Invention

The present invention relates to a flexible sheet-type piezoelectric ceramics-polymer composite material. Also, the present invention is concerned with a method for the preparation of the same.

2. Description of the Prior Art $Pb(Zr_xTi_{1-x})O_3$ (hereinafter referred to as "PZT"), widely used as a representative piezoelectric ceramic material, exhibits exceptionally high piezoelectric effects at morphotropic phase boundary (hereinafter referred to as "MPB") which is generated when the composition ratio of Zr to Ti is 52:48 in PZT, at which point PZT alternates between tetragonal phase and rhombohedral phase. In such composition, PZT is maximum in electromechanical coupling coefficient ($K_p$, $K_t$), piezoelectric charge coefficient (d) and dielectric constant ($\epsilon_r$).

Aside from its remarkable piezoelectric effect, PZT is an excellent piezoelectric material because it has no transition temperature in a temperature range of −50° to 200° C. therein. Accordingly, active research and development efforts have been directed to novel PZT piezoelectric materials.

Currently, PZT ceramics have been useful for a plurality of purposes including electromagnetic articles such as a transducer for medical diagnosis, an underwater sound detector, a buzzer, an ignition device and the like. The PZT ceramics have, however, a limit in application for fine medical diagnosis since it exhibits a sound impedance of 30 Mrayl which is considerably high relative to human skin showing a sound impedance of 1.5 Mrayl.

Meanwhile, most piezoelectric ceramics were bulk type. Such bulk-type piezoelectric ceramics have much difficulty in application for electromagnetic articles which have recently been on a trend of simplification, thinness, shortness and smallness. Accordingly, there have been studied for piezoelectric bodies of thick-film type or sheet type instead of bulk type. For the preparation of such sheet or thick-film type piezoelectric bodies, a polymeric material is used together with piezoelectric ceramics. Preferably, the polymeric material has superior molding processability and flexibility, and is easy to make large in area and possible to produce in large quantities.

Polyvinylidine fluoride (hereinafter referred to as "PVdF") and the copolymers thereof (e.g. TrFE, TFE) are useful for piezoelectric materials. PVdF, which has a sound impedance of 4 Mrayl is intensively used for transducers requiring especially low sound impedance. However, there are pointed out disadvantages in PVdF that it is low in electromechanical coupling coefficient ($K_t \approx 0.3$), small in dielectric constant ($\epsilon_r \approx 10$), and has high dielectric loss relative to piezoelectric ceramics.

In addition, not only does PVdF polymer poorly bind with ceramics, but pores are generated at the interfaces therebetween, which results in difficulty of producing a highly dense, precise piezoelectric material.

Making the best of the respective advantages of PZT ceramics and PVdF piezoelectric polymeric material, piezoelectric composite materials have been manufactured in a bulk type of pellet shape or in a sheet type with a thickness of several hundreds μm. However, these materials have many problems as follows.

On the one hand, the pellet-shaped bulk type piezoelectric composite material, lacks flexibility and is difficult to make large in area, like the bulk type utilizing pure piezoelectric ceramics, so that advantage cannot be taken of molding processability, a property of polymer. On the other hand, in the sheet type piezoelectric composite material, the adhesion of PZT to PVdF is neither uniform nor precise, resulting in the formation of pores at the interfaces between PZT and PVdF. Accordingly, in case of the sheet type piezoelectric composite material with a thickness of several hundreds μm, it is difficult to obtain a highly dense, precise composite material and also has deleterious effects in properties.

SUMMARY OF THE INVENTION

Therefore, an object of the present invention is to overcome the above problems encountered in prior arts and to provide a piezoelectric ceramics-polymer composite material, superior in binding strength between the PZT piezoelectric ceramics and the PVdF piezoelectric polymer and improved in electrical conductivity in the polymeric matrix, and a method for the preparation of the same.

In accordance with one aspect of the present invention, there is provided a piezoelectric ceramics-polymer composite material comprising 10 to 60% by volume of silane-coated PZT piezoelectric ceramics based on the total volume of the composition; at most 3% by volume of carbon powder based on the total volume of the composition; and balance volume of PVdF piezoelectric polymer.

In accordance with another aspect of the present invention, there is provided a method for preparing a piezoelectric ceramics-polymer composite material, comprising the steps of: adding silane to PZT piezoelectric ceramics powder in an amount sufficient to coat total surface of the PZT piezoelectric ceramics powder and mixing them well, to coat silane on the surface of PZT piezoelectric ceramic powder; mixing 10 to 60% by volume of the PZT piezoelectric ceramic powder coated with silane, at most 3% by volume of carbon powder, and PVdF piezoelectric polymer; molding the resulting mixture into a sheet.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PRESENT INVENTION

The present invention pertains to a piezoelectric ceramics-polymer composite material comprising silane-coated PZT piezoelectric ceramics with MPB structure, a polymer matrix, a coupling agent, and carbon powder.

In the composition, the PZT piezoelectric ceramics with MPB structure is added in amounts ranging from about 10 to about 60% by volume based on the total volume of the composition. Commercially available PZT can be employed. PZT with a diameter of about 5 μm is preferable.

PVdF is used to serve as a matrix for the piezoelectric material.

As a coupling agent in the composition of the present invention, silane is useful. Silane serves as a bridge between the piezoelectric ceramics and the polymer matrix to improve the bond strength therebetween. Commercially available silane can be employed. It is added in an amount sufficient to coat total surface of the ceramic particles, and its amount may differ depending on the amount, the kind and, especially, the particle size of PZT. That is, the smaller the PZT particles, the more silane is required.

With regard to carbon powder, commercially available carbon powder can be employed. Carbon powder having an average diameter of about 18 mm is preferred. In the composition, carbon powder is contained in an amount of at most 3% by volume, according to the present invention.

Now, a description will be made in conjunction with the effects of the coupling agent in the piezoelectric ceramics-polymer composite.

Figure 2:
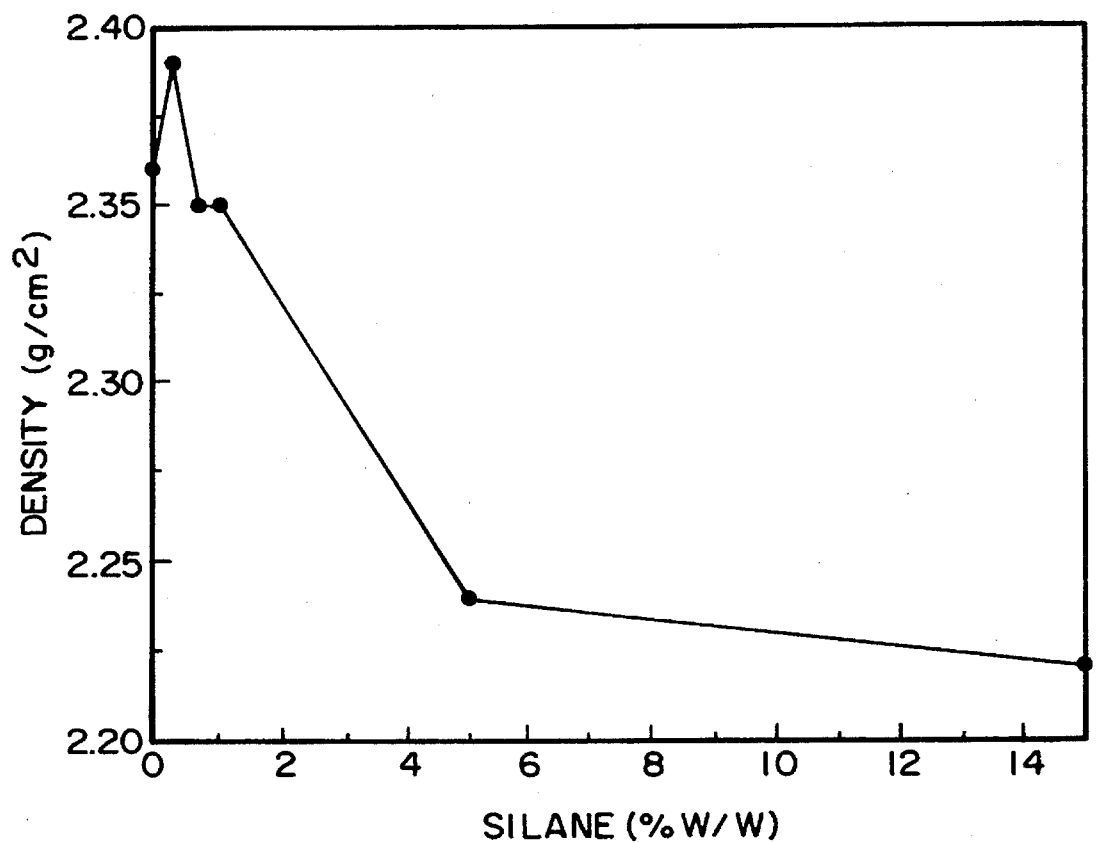
FIG. 2 is a graph showing the relation between the density of ceramics-polymer composite material and the amount of silane.

Referring to FIG. 2, there are plotted densities of the piezoelectric ceramics-polymer composite with regard to the amount of silane. In this figure, the first point corresponds to no silane and the second through the last points correspond to 0.3, 0.7, 1, 5 and 15% by weight of silane based on the weight of PZT, respectively. As shown in FIG. 2, the density of the piezoelectric ceramic-polymer composite is highest when the amount of silane is 0.3% by weight. The density of the piezoelectric ceramics-polymer composite reflects bond strength between the piezoelectric ceramics and the polymer and porosity therein. That is, high density in the composite means that the bond strength is strong and the porosity is low. According to the present invention, silane is added to the composition in an amount of at most 5% by weight based on the weight of PZT.

Figure 3A:
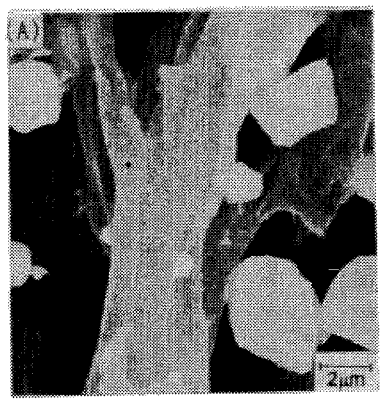
FIGS. 3A through 3F are scanning electron microscopic photographs corresponding to the added amount of silane of FIG. 2
Figure 3B:
Figure 3C:
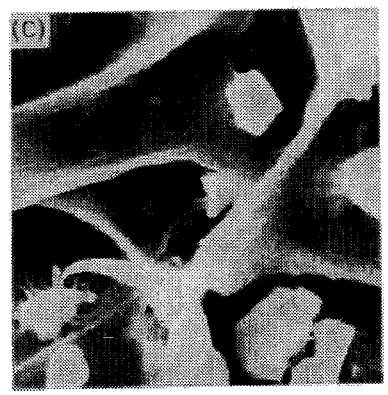
Figure 3D:
Figure 3E:
Figure 3F:

Referring to FIGS. 3A through 3F, there are scanning electron microscopic photographs of piezoelectric ceramics-polymer composites corresponding to the silane amounts of FIG. 2. That is, FIG. 3A is the case of absence of silane while FIGS. 3B to 3F correspond to 0.3, 0.7, 1, 5 and 15% by weight of silane. As shown in FIG. 3A, the ceramic particles merely physically attach to the polymer when the composite with no silane is molded through hot extrusion. On the other hand, silane allows the ceramics to bond with the polymer in the composite, as shown in FIG. 3B. However, too much silane causes the PZT particles to agglomerate rather than to disperse uniformly, leading to a decrease of bond strength between the ceramics and the polymer and to an increase of porosity in the composite.

The present invention also pertains to a method for the preparation of a piezoelectric ceramics-polymer composite material. The method of the present invention will be described in detail, hereinafter.

First, PZT powder is sintered and then pulverized finely in wet manner. The pulverization may be carried out in the usual manner, e.g. with a alumina ball mill, and preferably proceeds to a degree that PZT fine powder has an average diameter of about 5 μm. After being dried, the PZT fine powder is treated with silane. For prevention of adsorption of water, silane is dissolved in a volatile organic solvent. The silane treatment may be accomplished by adding the dissolved silane to the PZT fine powder in an amount sufficient to coat total surface of the PZT fine powder, well stirring the resulting mixture to coat the silane on the surface of the PZT powder and volatilizing the solvent. Preferred volatile organic solvent includes alcohol and acetone. As previously mentioned, silane plays a role in improving the bond strength between PZT and PVdF, a matrix.

Thereafter, the silane-coated PZT ceramic powder is dispersed in the matrix of PVdF in an amount of about 10 to about 60% by volume based on the total volume of the composition, followed by addition of carbon powder therein. In order to improve electric conductivity of the polymeric matrix, the amount of the carbon powder is in a range of at most 3% by volume in the composition. The mixture of silane-coated PZT, PVdF and carbon powder is well blended in the usual manner, for example, using a alumina ball mill.

Following completion of the blending, the resulting mixture is extruded into a sheet. For this, a hot extruder may be used. In this case, the sheet can have any thickness in a range of 50 to 300 μm.

Silver electrodes are mounted on the opposite faces of the sheet and subjected to polarization.

Usually, at a high electric field, discharge induces the material into dielectric breakdown. For prevention of this undesired phenomenon, polarization is performed. First, a sample is immersed in silicon oil of 120 ° C., and an electric field of 10 MV/m is applied. After 1 hour, the sample is rapidly cooled to room temperature while maintaining the electric field.

The piezoelectric ceramic-polymer composite according to the present invention is prepared in sheet form and exhibits flexible 0–3 connectivity. In addition, the sheet can be molded in an extrusion manner, so that it is easily adapted for mass production.

The preferred embodiment of the present invention will now be further described with reference to the following specific example.

EXAMPLE

Figure 1:
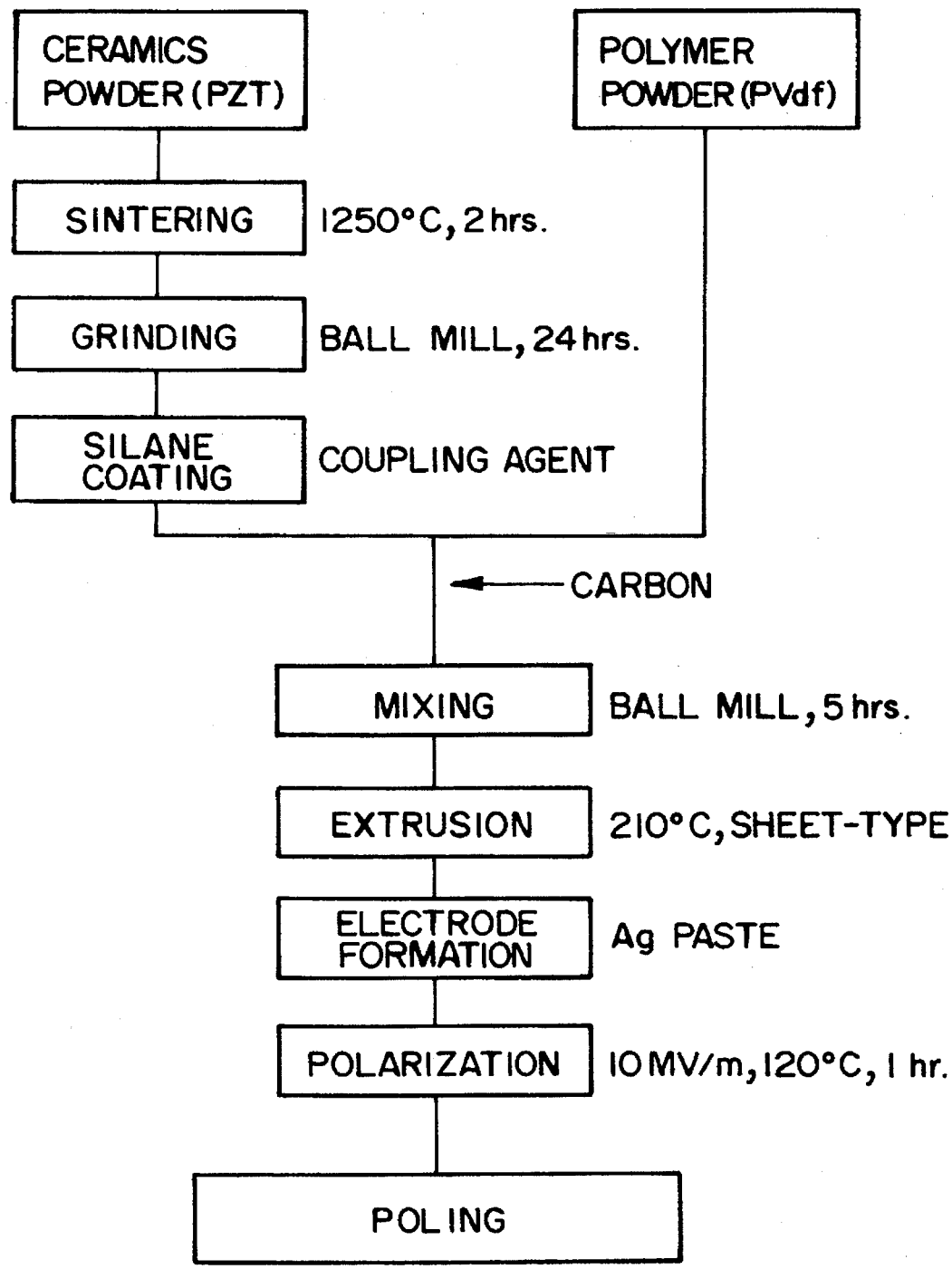
FIG. 1 is a flow-chart illustrating the procedure of the preparation method for piezoelectric ceramics-polymer composite material, according to an embodiment of the present invention.

In 78.5% by volume of PVdF, 20% by volume of PZT powder and 1.5% by volume of carbon were uniformly dispersed. Using a hot extruder, the dispersion was extruded into a sheet having a thickness of about 100 μm. Other detailed processes were carried out on the basis of the process flow shown in FIG. 1.

As PZT material, calcined powder having a composition for piezoelectric transducer was employed. The calcinated PZT powder was sintered at 1,250 ° C. for 2 hours according to typical PZT sintering process. Using distilled water, the sintered body was subjected to wet pulverization to a degree that the PZT powder had an average diameter of about 5 μm, and dried thereafter.

In order to investigate the effects of silane, PZT powder absent silane was compared with PZT powder treated with various amounts of silane. For silane-coated PZT powder, organosilane ester (commercially available from Union Carbide Company of USA) was dissolved in methanol in an amount of 0.3, 0.7, 1, 5, and 15% by weight based on the weight of PZT used, and mixed with the PZT powder, to coat silane on the surface of PZT. Thereafter, methanol was volatilized.

Optimal amount of silane was dependent on the weight ratio of PZT ceramics to the PVdF and the particle size of PZT. As shown in FIG. 2, when 0.3% by weight of silane was added, there was obtained a piezoelectric ceramic-polymer composite with the highest density near the theoretical value. The density rapidly dropped at a range of over 0.3% by weight.

Based on density measurements and close observation of the composite, in this embodiment, optimal amount of silane was 0.3% by weight in PZT-PVdF piezoelectric composite comprising 20% by volume of PZT having an average diameter of 5 μm. Accordingly, as piezoelectric composites for measuring piezoelectric effects, employed were those comprising 0.3% by weight of silane.

To the mixture of the silane-coated PZT and PVdF, carbon powder with an average diameter of about 18 nm was added in an amount of 1.5% by volume.

Thereafter, using a hot extruder, the resulting mixture was molded at 210° C. into a sheet which was 15 mm wide and 100 μm thick. Each of the two round-shaped silver electrodes with a diameter of 6 mm was mounted on the respective surface of the sheet in a silk-screen printing manner.

This sample was immersed in silicon oil of 120° C. and applied with an electric field of 10 MV/m. After 1 hour, the sample was rapidly cooled to room temperature with the electric field maintained.

Relative dielectric constant ($\epsilon_r$) and piezoelectric charge coefficient ($d_{33}$) of the prepared composite was measured and the results are given in the following Table 1.

TABLE 1

Properties of Piezoelectric Ceramic-Polymer Composite

| Composition | Rel. Dielectric Constant $\epsilon_r$ | Piezoelectric Coeff. $d_{33}$ ($\times 10^{-12}$ C/N) |
| --- | --- | --- |
| 20 vol % PZT-80 vol % PVdF | 26 | 8 |
| 20 vol % PZT(0.3 wt % silane)-80 vol % PVdF | 30 | 9 |
| 20 vol % PZT(0.3 wt % silane)-80 vol % PVdF −1.5 vol % carbon | 35 | 11 |

From the table, it is apparent that the addition of silane and carbon powder allows the composite to have high relative dielectric constant and piezoelectric charge coefficient.

Other features, advantages and embodiments of the invention disclosed herein will be readily apparent to those exercising ordinary skill in the art after reading the foregoing disclosures.

What is claimed is:

1. A piezoelectric ceramics-polymer composite comprising
   10 to 60% by volume of silane-coated PZT piezoelectric ceramics powder based on the total volume of the composition;
   at most 3% by volume of carbon powder based on the total volume of the composition; and
   balance volume of PVdF piezoelectric polymer.

2. The piezoelectric ceramic-polymer composite set forth as claim 1, wherein said composite has 0–3 connectivity.

3. The piezoelectric ceramic-polymer composite set forth as claim 1, wherein said composite is in sheet form.

4. The piezoelectric ceramic-polymer composite set forth as claim 1, wherein said silane-coated PZT piezoelectric ceramics powder is prepared by mixing PZT piezoelectric ceramics powder with silane dissolved in a volatile organic solvent in an amount sufficient to coat total surface of the PZT piezoelectric ceramics powder; and volatilizing the organic solvent.

5. The piezoelectric ceramic-polymer composite set forth as claim 1, wherein said silane is at most 5% by weight based on the weight of said PZT piezoelectric ceramics powder.

6. A method for preparing a piezoelectric ceramic-polymer composite, comprising the steps of:
   adding silane to PZT piezoelectric ceramic powder in an amount sufficient to coat total surface of the PZT piezoelectric ceramics powder and mixing them well, to coat silane on the surface of PZT piezoelectric ceramic powder;
   mixing 10 to 60% by volume of the silane-coated PZT piezoelectric ceramic powder, at most 3% by volume of carbon powder, and PVdF piezoelectric polymer;
   molding the resulting mixture into a sheet.

7. The method for preparing a piezoelectric ceramic-polymer composite set forth as claim 6, wherein said silane is used as a solution dissolved in a volatile organic solvent, and the volatile organic solvent is volatilized after mixing said silane and said PZT piezoelectric ceramic powder.

8. The method for preparing a piezoelectric ceramic-polymer composite set forth as claim 6, wherein said sheet is molded through extrusion.

9. The method for preparing a piezoelectric ceramic-polymer composite set forth as claim 6, wherein said sheet has a thickness of 50 to 300 μm.

* * * * *